(12) United States Patent
Fackler et al.

(10) Patent No.: US 11,563,458 B2
(45) Date of Patent: Jan. 24, 2023

(54) SYSTEMS AND METHODS FOR RADIO FREQUENCY HAZARD PROTECTION FOR EXTERNAL LOAD CONNECTIONS

(71) Applicant: CommScope Technologies LLC, Hickory, NC (US)

(72) Inventors: Karl-Heinz Fackler, Wemding (DE); Rainer Friedrich, Maihingen (DE); Anand Krishnamachari, Campbell, CA (US); Edmund W Chen, San Jose, CA (US)

(73) Assignee: CommScope Technologies LLC, Hickory, NC (US)

( * ) Notice: Subject to any disclaimer, the term of this patent is extended or adjusted under 35 U.S.C. 154(b) by 231 days.

(21) Appl. No.: 17/111,274

(22) Filed: Dec. 3, 2020

(65) Prior Publication Data
US 2021/0226659 A1 Jul. 22, 2021

Related U.S. Application Data

(60) Provisional application No. 62/963,939, filed on Jan. 21, 2020.

(51) Int. Cl.
*H04B 1/3827* (2015.01)
*H01Q 1/52* (2006.01)
(Continued)

(52) U.S. Cl.
CPC ........... *H04B 1/3838* (2013.01); *H01L 23/60* (2013.01); *H01L 27/0248* (2013.01);
(Continued)

(58) Field of Classification Search
CPC .... H04B 1/3838; H04B 1/0483; H04B 1/036; H04B 1/0458; H01L 23/60; H01L 27/0248; H01Q 1/526; H02H 9/042; H02H 9/046
(Continued)

(56) References Cited

U.S. PATENT DOCUMENTS 6,288,687 B1 * 9/2001 Glatz ..................... H01Q 1/242
                                                         343/702
6,507,499 B1    1/2003 Wilier
                      (Continued)

FOREIGN PATENT DOCUMENTS

KR       20110099515 A      9/2011

OTHER PUBLICATIONS

International Searching Authority, "International Search Report and Written Opinion from PCT Application No. PCT/US2020/063138", from Foreign Counterpart to U.S. Appl. No. 17/111,274, filed Mar. 18, 2021, pp. 1 through 11, Published: WO.

*Primary Examiner* — Dharti H Patel
(74) *Attorney, Agent, or Firm* — Fogg & Powers LLC (57) ABSTRACT

Systems and methods for RF hazard protection are provided. In one embodiment, a RF protection coupler comprises: a first port to couple to an output of an RF source circuit; a second port to couple to an external RF load; a source side and load side RF switches, wherein the source side RF switch and the load side RF switch are each switch between a first and second states in response to a detected matting. In the first state the source and load side RF switches establish an electrical path between the first and second ports. In the second state: the source side RF switch couples the first port to an impedance load that is impedance matched to the output of the RF source circuit; the load side RF switch couples the second port to an electrical ground; and a gap between the switches electrically isolates the ports.

20 Claims, 7 Drawing Sheets

(51) Int. Cl.
  *H04B 1/04* (2006.01)
  *H01L 23/60* (2006.01)
  *H02H 9/04* (2006.01)
  *H01L 27/02* (2006.01)

(52) U.S. Cl.
  CPC ............ *H01Q 1/526* (2013.01); *H02H 9/042* (2013.01); *H02H 9/046* (2013.01); *H04B 1/0483* (2013.01)

(58) Field of Classification Search
  USPC .......................................................... 361/54
  See application file for complete search history.

(56) References Cited

U.S. PATENT DOCUMENTS

| | | | |
|---|---|---|---|
| 2013/0015717 A1 | 1/2013 | Dykstra | |
| 2013/0215808 A1* | 8/2013 | Muthukrishnan | H02H 9/046 370/297 |
| 2015/0132058 A1* | 5/2015 | Anderson | E01C 19/48 404/84.05 |
| 2017/0170562 A1* | 6/2017 | Lee | H01Q 9/14 |

\* cited by examiner

SYSTEMS AND METHODS FOR RADIO FREQUENCY HAZARD PROTECTION FOR EXTERNAL LOAD CONNECTIONS

CROSS-REFERENCE TO RELATED APPLICATIONS

This patent application is a U.S. Patent Application claiming priority to, and the benefit of, U.S. Provisional Patent Application No. 62/963,939 titled "SYSTEMS AND METHODS FOR RADIO FREQUENCY HAZARD PROTECTION FOR EXTERNAL LOAD CONNECTIONS" and filed on Jan. 21, 2020, which is incorporated herein by reference in its entirety.

BACKGROUND

Electrostatic discharge (ESD) and reflected RF power are both hazards that can endanger personnel and equipment that are located in close proximity to operable RF signal circuits and transmitters. For example, when an antenna is decoupled from the antenna port of operating transceiver electronics, electrostatic charges can develop at the antenna port. If persons or equipment come within a sufficient proximity of the electrostatically charge antenna port, a path to ground may be created that allows a discharge current to flow through the persons or equipment causing them substantial harm. Reflected RF power can occur if a transmitter attempts to transmit from the decoupled antenna port. As opposed to the transmitter delivering RF power into a impedance matched antenna (causing it to radiate as a wireless RF signal), the mis-matched impedance of the open circuit antenna port will cause substantially all of the RF power that the transmitter attempted to transmit from the antenna port to reflect back into the transceiver (and in some cases receiver) circuitry, causing substantial equipment damage. One current technique to attempt to mitigate such hazards include the installation of a diode at a transmitter's output to shunt ESD and/or reflected RF power to ground. However, such techniques introduce a capacitance onto the antenna port that reduces transmission efficiencies.

For the reasons stated above and for other reasons stated below which will become apparent to those skilled in the art upon reading and understanding the specification, there is a need in the art for systems and methods for radio frequency hazard protection for external load connections.

SUMMARY

In one embodiment, a radio frequency (RF) protection coupler comprises: a first port configured to couple to an output of an RF source circuit; a second port configured to couple to an external RF load; a source side RF switch and a load side RF switch, wherein the source side RF switch and the load side RF switch are each configured to switch between a first state and a second state in response to a detected matting status of a connector from the external RF load with the second port; wherein the first state is defined by the connector from the external RF load being mated with the second port, wherein in the first state the source side RF switch and the load side RF switch establish an electrically conductive RF signal path between the first port and second port; wherein the second state is defined by the connector from the external RF load being un-mated with the second port, wherein in the second state: the source side RF switch couples the first port to an impedance load, wherein the impedance load is impedance matched to the output of the RF source circuit; the load side RF switch couples the second port to an electrical ground; and an air gap between the source side RF switch and the load side RF switch electrically isolates the first port from the second port.

DRAWINGS

Embodiments of the present disclosure can be more easily understood and further advantages and uses thereof more readily apparent, when considered in view of the description of the preferred embodiments and the following figures in which.

In accordance with common practice, the various described features are not drawn to scale but are drawn to emphasize features relevant to the present disclosure. Reference characters denote like elements throughout figures and text.

DETAILED DESCRIPTION

In the following detailed description, reference is made to the accompanying drawings that form a part hereof, and in which is shown by way of specific illustrative embodiments in which the embodiments may be practiced. These embodiments are described in sufficient detail to enable those skilled in the art to practice the embodiments, and it is to be understood that other embodiments may be utilized and that logical, mechanical and electrical changes may be made without departing from the scope of the present disclosure. The following detailed description is, therefore, not to be taken in a limiting sense.

Figure 1:
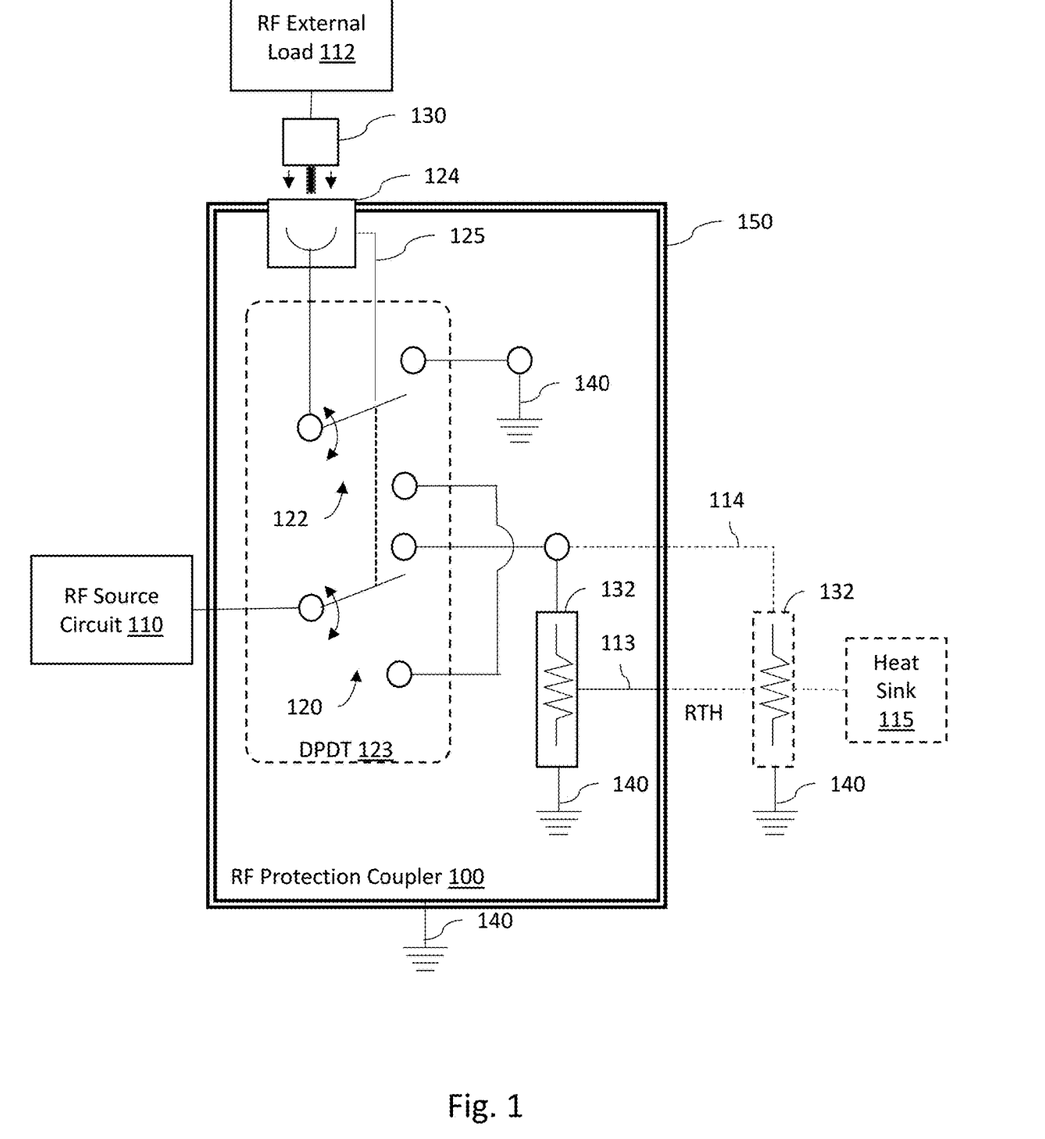
FIG. 1 is an electrical schematic diagram illustrating an example radio frequency protection coupler embodiment.

One or more of the embodiments presented in this disclosure provide solutions for protecting equipment and personnel from electrostatic discharge (ESD) and reflected RF power hazards that may arise when RF loads are disconnected from RF circuits. The embodiments described herein are not limited to particular RF system architectures, but may be used in conjunction with wireless network access points (for example, IEEE 802.11 (WiFi) access points), distributed antenna systems, RF repeaters, cellular communications base stations, and small cell base stations or other RF signal transport, processing, or transceiver devices. FIG. 1 is a schematic electrical diagram for an example RF protection coupler 100 embodiment. As shown in FIG. 1, RF protection coupler 100 is position between an RF source circuit 110 and an external RF load 112 and operated to mitigate hazards of ESD and reflected power that can arise when the external RF load 112 becomes un-mated from the RF source circuit 110. In alternate implementations, the RF source circuit may comprise RF transmitter circuits and/or other RF signal processing electronics that transport RF signals to the external RF load 112. In some embodiments, the external RF load 112 may comprise an antenna configured to radiate the RF signals received from the RF source circuit 110 as wireless RF transmissions. In still other embodiments, the external RF load 112 may comprise RF signal processing electronics to further process the RF signals received from the RF source circuit 110. Operation of the RF protection coupler 100 is not limited by signal transport direction so that the RF signals transported from the RF source circuit 110 in the direction to the external RF load 112 may comprise uplink RF signals is some embodiments, or downlink RF signals is other embodiments. That is, in alternate embodiments, the external RF load 112 may either be downlink from the RF source circuit 110, or uplink from the RF source circuit 110.

In the embodiment shown in FIG. 1, the RF protection coupler 100 includes a first RF switch 120 (which may be referred to herein as the source side RF switch 120) and a second switch 122 (which may be referred to herein as the load side RF switch 122). In some embodiments, the source side RF switch 120 and load side RF switch 122 may be implemented using a double pole-double throw switching device 123 as illustrated in FIG. 1. In other embodiments, the source side RF switch 120 and load side RF switch 122 may be implemented using distinct switching devices. The RF protection coupler 100 further includes a load connector port 124 through which the RF load 112 may be coupled to the RF protection coupler 100. In some embodiments, the load connector port 124 comprises a linkage 125 that senses a mating status of the RF load 112 to the load connector port 124. In other words, when a connector 130 for the RF load 112 is coupled to the load connector port 124, the linkage 125 operates the source side RF switch 120 and load side RF switch 122 to toggle or switch states. Conversely, when a connector 130 for the RF load 112 is de-coupled from the load connector port 124, the linkage 125 operates the source side RF switch 120 and load side RF switch 122 to again toggle or switch states. In some embodiments, the linkage 125 may operate in response to the force of insertion of a center conducting pin of the connector 130 into a basket or pin receiver mechanism of the load connector port 124. For example, the connector 130 may comprise a coaxial cable connector that includes a center pin for carrying RF communications signals, and an outer conductor that couples to a threaded ground conductor of the connector 130. As the threaded ground conductor is tightened onto the threaded ground conductor of the load connector port 124, the center pin of the connector 130 applies pressure against a pin receiver within the load connector port 124 which operates the linkage 125. One example of such an embodiment is further described below.

When no connector 130 from the RF load 112 is coupled to the load connector port 124 (referred to herein as an un-matted external load configuration) the source side RF switch 120 is maintained in a state where the output of the RF source circuit 110 is electrically coupled to ground 140 through an impedance load 132, the load side RF switch 122 is maintained in a state where the load connector port 124 is electrically coupled to ground 140, and the output of the RF source circuit 110 is electrically isolated from the load connector port 124 by at least one electrically open air gap. When a connector 130 for external RF load 112 is coupled to the load connector port 124 (referred to herein as the matted external load configuration) the linkage 125 causes the source side RF switch 120 and load side RF switch 122 to toggle. In this matted external load configuration, the source side RF switch 120 is operated to decoupled the RF source circuit 110 from the impedance load 132, the load side RF switch 122 is operated to decouple the load connector port 124 from the ground 140, and an electrical path is completed through the load side RF switch 122 and load side RF switch 120 to electrically coupled the output of the RF source circuit 110 to the external RF load 112. When the connector 130 for RF load 112 is again de-coupled to the load connector port 124 (returning to the un-mated configuration) where the source side RF switch 120 toggles back to the state where the output of the RF source circuit 110 is electrically coupled to ground 140 through an impedance load 132, the load side RF switch 122 toggles back to the state where the load connector port 124 is electrically coupled to ground 140, and the output of the RF source circuit 110 is again electrically isolated from the load connector port 124 by at least one electrically open air gap. While the linkage 125, in some embodiments, may operate to toggle the first the source side RF switch 120 and load side RF switch 122 simultaneously between states in a lock-step manner. In other embodiments, the linkage 125 may instead toggle the state of one before the other. For example, in some embodiments when the connector 130 is removed from the load connector port 124, the source side RF switch 120 may be toggled to electrically couple the output of the RF source circuit 110 to ground 140 through the impedance load 132 before the load side RF switch 122 is operated to couple the load connector port 124 to the ground 140.

Several technical effects are achieved by such operation of the RF protection coupler 100 to protect both RF equipment and persons in the vicinity during periods of time when the external RF load 112 is unmated. Coupling the external load connector port 124 to ground 140 brings the signal carrying conductor(s) of the load connector port 124 to the same electrical potential as the ground conductor of the load connector port 124 (an in some embodiments, the same electrical potential as the housing 150 of the RF protection coupler 100) inhibiting the ability for electrostatic charges to develop at the unmated load connector port 124. With respect to damage due to the RF source circuit 110 due to reflected power, in this unmated state, the output of the RF source circuit 110 is coupled to an impedance load 132 that has an input impedance matching that of the RF source circuit 110 output specification. For example, if the output of the RF source circuit 110 is a 50 ohm port designed to deliver a maximum RF power output at rated frequency into a 50 ohm load, then the impedance load 132 would have a 50 ohm impedance selected to match that load. In this way, output of RF power from the RF source circuit 110 would be impedance matched and fully delivered to the impedance load 132. There would be only minimal reflected power reflected back into the RF source circuit 110 due to any slight impedance mismatch. The degree of impedance matching needed between the output of RF power from the RF source circuit 110 and the impedance load 132 may be based on the amount of RF reflected power the RF source circuit 110 is designed to receive, and would be a parameter that one skilled in the art of RF electronics who has read this disclosure could readily determine.

Because any RF power output from the RF source circuit 110 delivered to impedance load 132 that is not reflected back will need to be absorbed and the resulting heat dissipated by the impedance load 132, the impedance load 132 may be thermally coupled by a low thermal resistance conductive heat path 113 to a heat sink that will dissipate the resulting heat into the ambient environment. In one embodiment, the conductive heat path 113 may be coupled to the housing 150 of the RF protection coupler 100 so that heat dissipated by the impedance load 132 is directly conductively communicated to the housing 150 for dissipation into the ambient environment. In some embodiments, the impedance load 132 itself may be an integrated component of the housing 150 so that heat is directly conducted from the impedance load 132 into the housing 150. In other embodiments, the impedance load 132 may be located outside of the housing 150 of the RF protection coupler 100. In such an embodiment, the impedance load 132 would be electrically coupled to the source side RF switch 120 through an electrical trace and/or port 114. In such an embodiment, a externally located impedance load 132 may be thermally coupled to the housing 150 so that heat is directly conducted from the impedance load 132 into the housing 150, or optionally conductively coupled to another external heat sink 115.

Persons present in the vicinity of the RF source circuit 110 output are thus protected from the hazards of electrostatic discharge because the only exposed electrical component that could be potentially energized by the RF source circuit 110 output is the load connector port 124, which has been both grounded and separated by an air gap from the RF source circuit 110 output by the air gap within the RF protection coupler 100. Moreover, the RF source circuit 110 is protected from the hazards of reflected power in the case where a transmitter or power amplifier of the RF source circuit 110 is inadvertently or unintentionally energized while the external RF load 112 is unmated. Any transmitted RF power in this condition would be delivered into the impedance matched impedance load 132 and the resulting heat produced from absorbing the RF power dissipated into the ambient environment either through the housing of the coupler or through another heat sink.

Figure 2A:
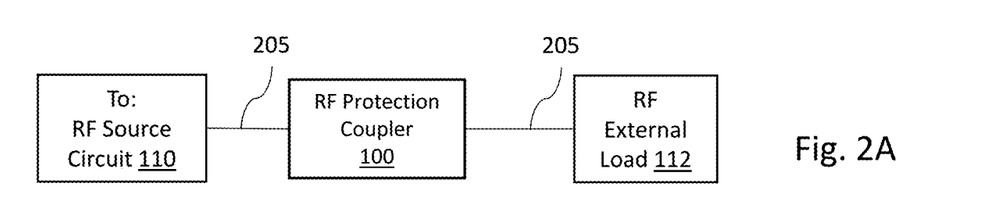
FIGS. 2A, 2B, 2C and 2D are block diagrams illustrating example embodiments of various radio frequency protection coupler configurations.
Figure 2B:
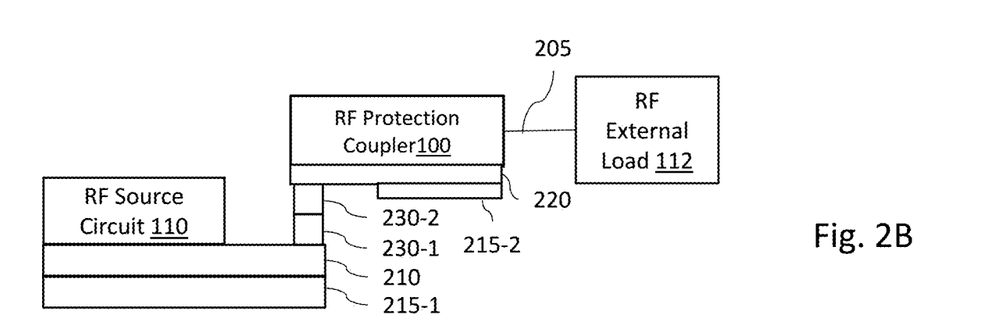
Figure 2C:
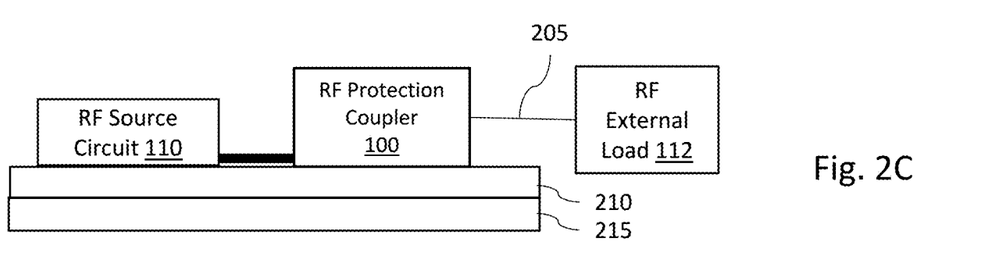
Figure 2D:
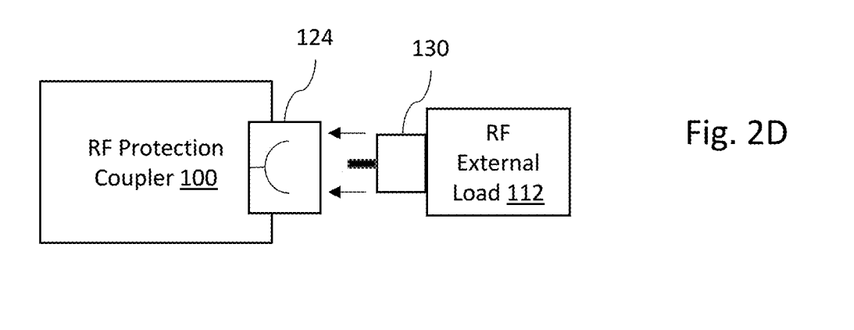

In some embodiments, the RF protection coupler 100 is implemented as a distinct device element that is coupled to the RF source circuit 110 and the external RF load 112 by respective cables 205 as shown in FIG. 2A. However, in other embodiments, different types of interconnection configurations may be utilized. For example, FIG. 2B illustrates a configuration where the RF source circuit 110 comprises one or more electronic components mounted to a first circuit board 210, the RF protection coupler 100 is implemented as one or more electronic components mounted to a second circuit board 220. The first circuit board 210 and second circuit board 220 each comprise compatible edge connector interface hardware (shown at 230-1 and 230-2, respectively) that electrically couple the RF source circuit 110 output to the circuitry of the RF protection coupler 100 as discussed above in FIG. 1. In such an embodiment, a heat sink 215-2 may be mounted onto the second circuit board 220 and thermally coupled to an impedance load (such as the impedance loads 132 shown in FIG. 1) by a trace on the second circuit board 220. In other embodiments, heat produced in such an impedance load may be transferred to the first circuit board 210 (through the edge connector interface hardware 230-1, 230-2, for example) for dissipation into the ambient environment by a heat sink 215-1 coupled to the first circuit board 210. In other embodiments, the RF protection coupler 100 and RF source circuit 110 may share a common circuit board 210 as shown in FIG. 2C. In such an embodiment, the heat produced in an impedance load (such as the impedance loads 132 shown in FIG. 1) may be transferred to a heat sink 215 through the common circuit board 210. FIG. 2D illustrates another embodiment of a configuration where the connector 130 is an element integral to the external RF load 112 itself rather than for a cable coupled to the external RF load 112. The external RF load 112 is coupled directly to the load connector port 124 of the RF protection coupler 100. In such an embodiment, the RF protection coupler 100, in turn, may be coupled to the RF source circuit 110 in any of the alternative example configurations shown in FIG. 2A, 2B or 2C.

Figure 3A:
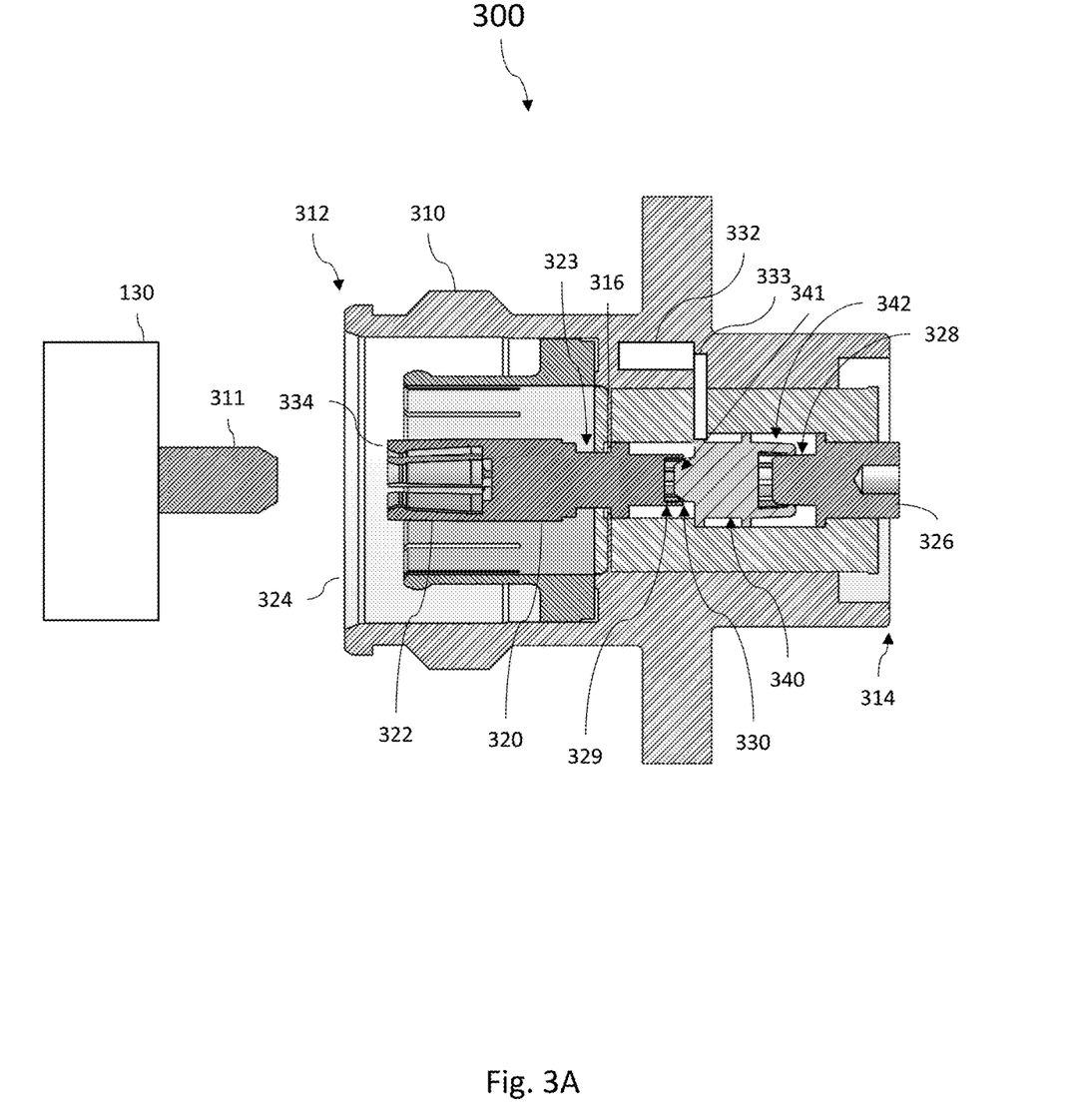
FIGS. 3A and 3B are cross-sectional diagrams illustrating an example radio frequency protection coupler embodiment.
Figure 3B:
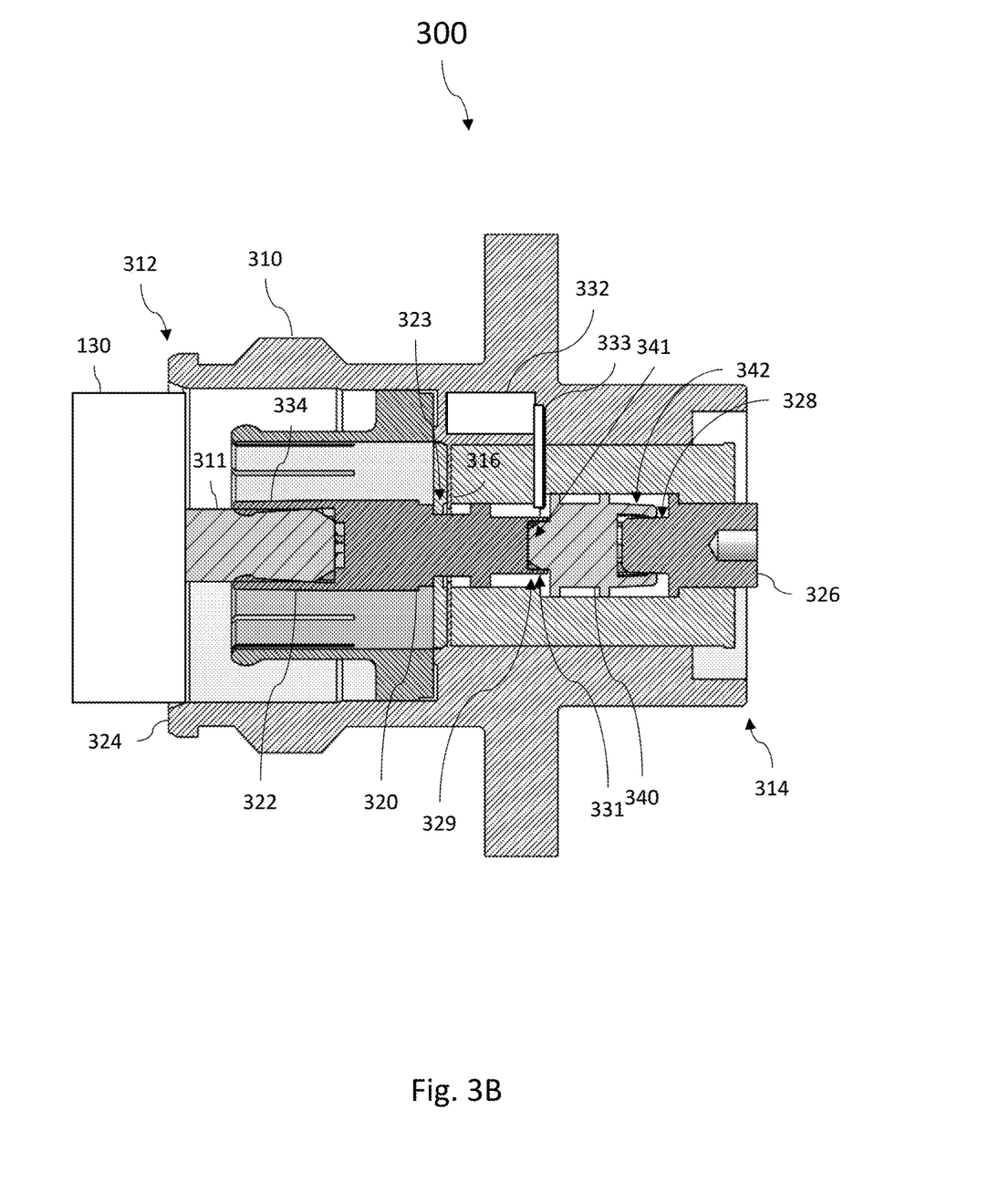

FIGS. 3A and 3B is are each cross-sectional views of an example RF protection coupler 100 embodiments as shown in FIG. 1 implemented in a mechanical structure as protection coupler 300. Specifically, FIG. 3A illustrates the state of the protection coupler 300 in the un-matted external load configuration while FIG. 3B illustrates the state of the protection coupler 300 in the matted external load configuration. Protection coupler 300 comprises a metallic electrically conducting housing 310 having a first end 312 that defines a load connector port 324. The load connector port 324 functions in the same manner as described above for load connector port 124 for coupling the protection coupler 300 to an external RF load 112. The conducting housing 310 also includes a second end 314 that has a port 326 for electrically coupling the protection coupler 300 to the RF source circuit 110 output. In some embodiments, the port 326 may comprise a cable connector, and/or may include a pin solder location to electrically connect the port 326 to a conductor or trace of a circuit board as described above. The protection coupler 300 further comprises a movable load side center pin 320 and a floating spring loaded coupler 340 which operate together to implement the source and load side RF switches 120 and 122 as explained below.

The load side center pin 320 includes a pin receiver basket 322 at the load connector port 324 and has a freedom of movement to slide within the housing 310 in response to a force applied when receiving a center pin of connector 130 (shown at 311) into the basket 322 of the center pin 320. More specifically, the center pin 320 and basket 322 can be spring loaded by a spring element that applies a force that pushes the center pin 320 and basket 322 in an outward direction towards the load connector port 324. The housing 310 may include stops that limit the range of motion of the center pin 320 and basket 322 so that it is not pushed out from the housing 310 by the spring tension. The basket 322 functions as a pin receiver into which the center pin 311 of connector 130 is inserted. The basket 322 may comprise a plurality of conductive fingers 334 that flex outward to expand as the center pin 311 is received in the basket 329 and maintain a pressure on the center pin 311 to ensure that constant electrical continuity between the center pin 311 and the center pin 320 is maintained.

The center pin 320 includes a slot (shown at 323) at least partially around its circumference that functions to implement the load side RF switch 122 shown in FIG. 1. With the protection coupler 300 in the un-matted external load configuration as shown in FIG. 3A, the center pin 320 and basket 322 are fully extended outward in the direction of the first end 312 that has the load connector port 324. A ground connection conductor 316 extends from the housing 310 partially into the slot 323, and in the un-matted external load configuration, contacts a wall of the slot 323 so as to complete an electrical path between the center pin 320 and the housing 310 effectively grounding the center pin 320 and basket 322 to the housing 310. In some embodiments, the housing 310 may itself be electrically coupled to an equipment ground or earth ground via its connection to the RF source circuit 110 or by other connections. With the center pin 320 and basket 322 thus fully extended, an air gap 330 is present between the external center pin 320 and the floating spring loaded coupler 340 electrically isolating the center pin 320 from the RF source circuit 110 output.

In this embodiment, the floating spring loaded coupler 340 is a spring loaded movable element within the housing 310 that has freedom of movement to slide within the housing 310 in response to a force applied by the center pin 320 and functions as the source side RF switch 120. In the embodiment shown in FIG. 3A, the floating spring loaded coupler 340 includes a coupling pin 341 and a basket 342. The coupling pin 341 operates in conjunction with an internal basket 329 of the center pin 320. The basket 342 operates in conjunction with a fixed position coupling pin 328 of the port 326, as discussed in more detail below. The basket 329 functions as a pin receiver into which the coupling pin 341 of floating spring loaded coupler 340 is inserted. The basket 342 functions as a pin receiver into which the coupling pin 328 of the fixed port 326 is inserted. The baskets 329 and 342 may each comprise a plurality of conductive fingers that flex outward to expand as their respective counterpart coupling pins are received to maintain a pressure to ensure that constant electrical continuity is maintained.

The floating spring loaded coupler 340 may be spring loaded by another spring element that applies a force that pushes the floating spring loaded coupler 340 towards the center pin 320 and away from the coupling pin 328 of the port 326. However, the range of motion of the floating spring loaded coupler 340 is limited by stops within the housing 310 that prevent the floating spring loaded coupler 340 from reaching and contacting center pin 320 in the un-mated configuration when both are in their extended positions. The separation of center pin 320 from coupler 340 establishes an air gap 330 between the center pin 320 and floating spring loaded coupler 340 when in the un-mated configuration. In addition, even with the floating spring loaded coupler 340 in its extended position, the coupling pin 328 of the fixed port 326 remain inserted in, and in electrical continuity with, the basket 342 of floating spring loaded coupler 340, thus maintaining electrical continuity between the floating spring loaded coupler 340 and the port 326 as the coupler 340 slides within the housing 310.

The protection coupler 300 also comprises an impedance load 332 that is embedded within a body of the housing 310 of the protection coupler 300. This impedance load 332 functions as described above with respect to the impedance load 132. In the un-mated configuration when the floating spring loaded coupler 340 of port 326 is extended, the floating spring loaded coupler 340 comes into contact with an embedded electrical conductor 333 that couples the floating spring loaded coupler 340 to the impedance load 332.

In this state of an un-mated configuration, the protection coupler 300 thus implements the electrostatic discharge and reverse hazard protections discussed with FIG. 1. Persons and equipment are protected from the hazards of electrostatic discharge because the only exposed electrical component that could be potentially energized by the RF source circuit 110 output is the load connector port 324, for which the center pin 320 has been grounded to the housing 310 and separated by air gap 330 from the floating spring loaded coupler 340 electrically isolating the load connector port 324 from the RF source circuit 110 output. Additionally, the RF source circuit 110 is protected from the hazards of reflected power because any transmitted RF power in this condition would be delivered into the impedance matched load 332 within the housing 310 and the resulting heat produced from absorbing the RF power dissipated into the ambient environment either through the housing 310 of the coupler and/or via another heat path through the housing 310 to a heat sink.

FIG. 3B illustrates the protection coupler 300 in the mated configuration or state where the center pin 311 of the connector 130 has been inserted into the basket 322. The force applied by the center pin 311 counters and overcomes the spring loading of the center pin 320 sliding the center pin 320 into the housing 310. This sliding action breaks the electrical contact between the ground connection conductor 316 and the center pin 320 while also closing the air gap 330 between the center pin 320 and floating spring loaded coupler 340. The force from the center pin 320 sliding into the housing also counters the spring loading of the floating spring loaded coupler 340 thus sliding the floating spring loaded coupler 340 back towards the coupling pin 328 of the fixed port 326 (which further inserts the coupling pin 328 into the basket 342 of the coupler 340. The sliding of floating spring loaded coupler 340 also acts to break the electrical contact between the embedded electrical conductor 333 and floating spring loaded coupler 340, thus decoupling the floating spring loaded coupler 340 from the impedance load 332. The spring loading of the floating spring loaded coupler 340 maintains a pressure by the coupling pin 341 into the inner basket 329 of the center pin 320 to ensure that electrical continuity between the center pin 320 and the floating spring loaded coupler 340 is maintained (shown in FIG. 3B at 331) while in the mated configuration. This configuration thus completes the electrical path through the protection coupler 300 of the RF source circuit 110 to the external RF load 112. Removal of the connector 130 causes the center pin 320 and the floating spring loaded coupler 340 to return to their positions shown in FIG. 3A, to again establish protection against ESD and reflected power hazards.

In some embodiments, the RF source circuit 110 may comprise a processor, sensors and/or other electronic circuits (such as a controller 430 for example) that can sense the state of an RF protection coupler 100 as being in either the mated or unmated configuration and turn off transmission circuitry within the RF source circuit 110 when the RF protection coupler 100 is switched to an unmated state. For example, one or both of the switches 120 and 122 may comprise dry contacts that change state with the switches, and the status of those contacts as opened or closed may be read and used to shut off the transmission circuitry when the RF protection coupler 100 is switched to the unmated state. In another embodiment, one or more thermal sensors may be utilized in conjunction with the RF protection coupler 100 (or internal to the RF protection coupler 100) to sense when an elevated temperature of an impedance load 132, heat sink 115, housing 150, and/or other element has risen above a thermal threshold indicating that RF power from the RF source circuit 110 is being directed to ground 140 by the RF protection coupler 100. When the processor senses from the thermal sensors that such a thermal threshold is being exceeded, it may response by shutting off the transmission circuitry within the RF source circuit 110.

As mentioned above, the various embodiments of RF energy protection couplers described herein may be used in conjunction with any number of RF circuits and system architectures such as, but not limited to: wireless network access points, distributed antenna systems, RF repeaters, cellular communications base stations, and small cell base stations.

Figure 4:
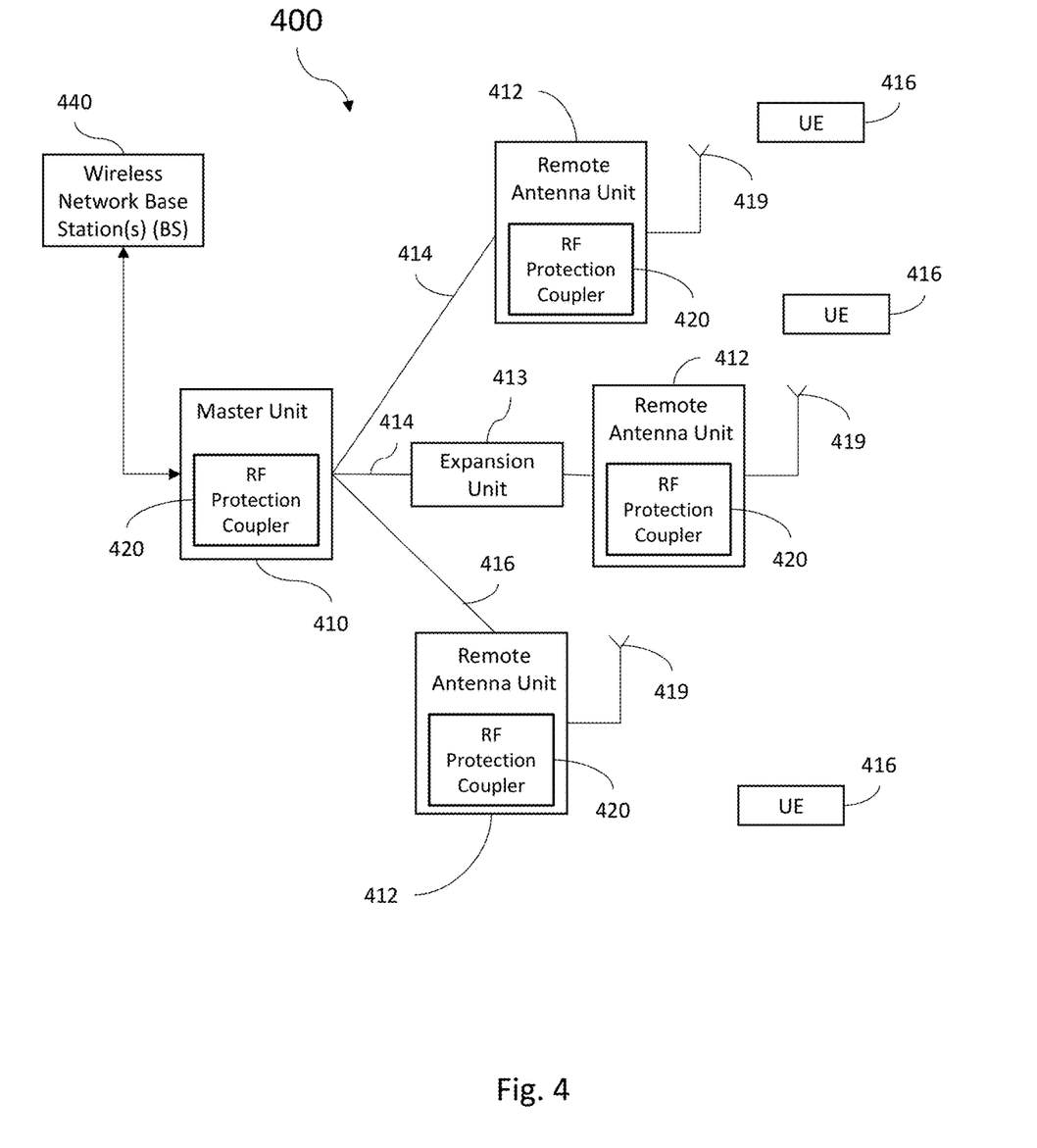
FIGS. 4, 4A, 4B and 4C are a block diagrams illustrating an example distributed antenna system embodiment.

FIG. 4 is a block diagram of one exemplary embodiment of a distributed antenna system (DAS) 400 that includes the utilization of RF energy protection couplers as described herein. As shown in FIG. 4, the DAS 400 comprises a master unit 410 communicatively coupled to one or more remote antenna units 412 via one or more communication links 414. In various different embodiments, the communication links 414 may comprise wireless communication links, cables (i.e. wired communication links), or some combination thereof. As used herein, the term cable is used generically and may refer to either electrical or fiber optic cables, or hybrid cables comprising both electrical conductors and optical fibers. It should be understood that DAS 400 may provide wireless telecommunication services to a building, plant, campus, transportation hub, tunnel, or any other type of facility. In some embodiments, the communication links 414 discussed herein may each operate bidirectionally with downlink and uplink communications carried over the link. Each remote antenna unit 412 can be communicatively coupled directly to one or more of the master units 410 or indirectly via one or more other remote antenna units 412 and/or via one or more intermediary or expansion units 413.

Each master unit 410 is communicatively coupled to one or more base stations 440. One or more of the base stations 440 can be co-located with the respective master unit 410 to which it is coupled (for example, where the base station 440 is dedicated to providing base station capacity to the DAS 400 and is coupled to the respective master unit 410). Also, one or more of the base stations 440 can be located remotely from the respective master units 410 to which it is coupled (for example, where the base station 440 provides base station capacity to an area beyond the coverage area of the DAS 400). In this latter case, the master unit 410 can be coupled to a donor antenna and repeater or bi-directional amplifier in order to wirelessly communicate with the remotely located base station 440.

In this exemplary embodiment, the base stations 440 also can include one or more base stations that are used to provide commercial cellular wireless service. Such base stations are also referred to here as "commercial wireless service base stations" or "commercial base stations." The base stations 440 may also include one or more base stations that are used to provide public and/or private safety wireless services (for example, wireless communications used by emergency services organizations such as police, fire and emergency medical services) to prevent or respond to incidents that harm or endanger persons or property. Such base stations are also referred to here as "safety wireless service base stations" or "safety base stations."

The base stations 440 can be coupled to the master units 410 using a network of attenuators, combiners, splitters, amplifiers, filters, cross-connects, etc., (sometimes referred to collectively as a "point-of-interface" or "POI"). This network can be included in the master units 410 and/or can be separate from the master units 410. This is done so that, in the downlink, the desired set of RF channels output by the base stations 440 can be extracted, combined, and routed to the appropriate master units 410, and so that, in the upstream, the desired set of carriers output by the master units 410 can be extracted, combined, and routed to the appropriate interface of each base station 440. It is to be understood, however, that this is one example and that other embodiments can be implemented in other ways.

Figure 4A:
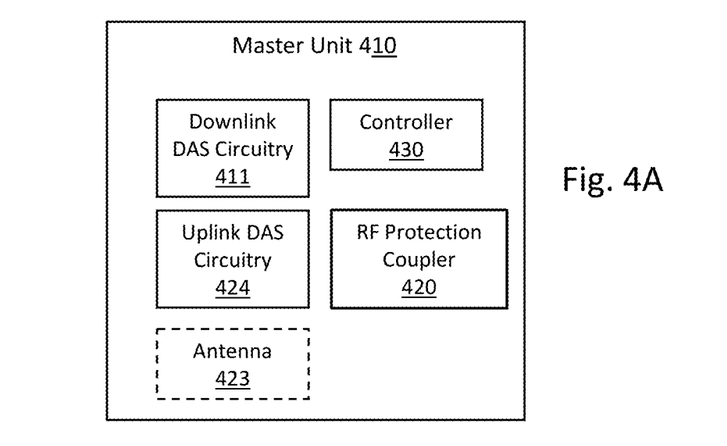

As shown in FIG. 4A, in general, each master unit 410 comprises downlink DAS circuitry 411 that is configured to receive one or more downlink signals from one or more base stations 440. These signals are also referred to here as "base station downlink signals." Each base station downlink signal includes one or more radio frequency channels used for communicating in the downlink direction with user equipment (UE) 416 (such as tablets or cellular telephone, for example) over the relevant wireless air interface. Typically, each base station downlink signal is received as an analog radio frequency signal, though in some embodiments one or more of the base station signals are received in a digital form (for example, in a digital baseband form complying with the Common Public Radio Interface ("CPRI") protocol, Open Radio Equipment Interface ("ORI") protocol, the Open Base Station Standard Initiative ("OBSAI") protocol, a fronthaul protocol supported by the Open RAN ("O-RAN") Alliance, or other protocol). The downlink DAS circuitry 411 in each master unit 410 is also configured to generate one or more downlink transport signals derived from one or more base station downlink signals and to transmit one or more downlink transport signals to one or more of the remote antenna units 412.

Figure 4B:
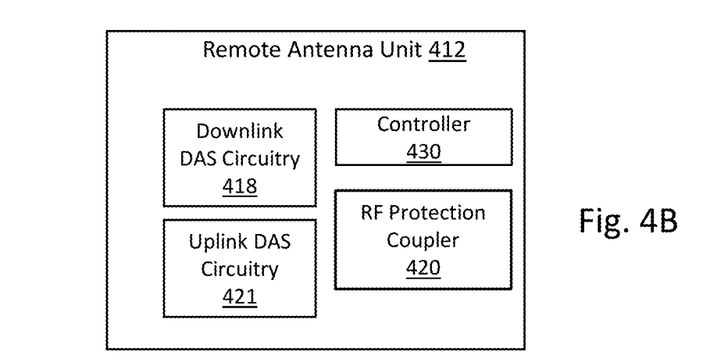

As shown in FIG. 4B, each remote antenna unit 412 comprises downlink DAS circuitry 418 that is configured to receive the downlink transport signals transmitted to it from one or more master units 410 and to use the received downlink transport signals to generate one or more downlink radio frequency signals that are radiated from one or more antennas 419 associated with that remote antenna unit 412 for reception by user equipment 416. These downlink radio frequency signals are analog radio frequency signals and are also referred to here as "remote downlink radio frequency signals." Each remote downlink radio frequency signal includes one or more of the downlink radio frequency channels used for communicating with user equipment 416 over the wireless air interface. In this way, the DAS 400 increases the coverage area for the downlink capacity provided by the base stations 440.

Each remote antenna unit 412 also comprises uplink DAS circuitry 421 that is configured to receive via antenna(s) 419 one or more uplink radio frequency signals transmitted from the user equipment 416. These signals are analog radio frequency signals and are also referred to here as "remote uplink radio frequency signals." Each uplink radio frequency signal includes one or more radio frequency channels used for communicating in the uplink direction with user equipment 416 over the relevant wireless air interface. The uplink DAS circuitry 421 in each remote antenna unit 412 is also configured to generate one or more uplink transport signals derived from the one or more remote uplink radio frequency signals and to transmit one or more uplink transport signals to one or more of the master units 410.

Each master unit 410 comprises uplink DAS circuitry 424 that is configured to receive the respective uplink transport signals transmitted to it from one or more remote antenna units 412 and to use the received uplink transport signals to generate one or more base station uplink radio frequency signals that are provided to the one or more base stations 440 associated with that master unit 410. Typically, this involves, among other things, combining or summing uplink signals received from multiple remote antenna units 412 in order to produce the base station signal provided to each base station 440. Each base station uplink signal includes one or more of the uplink radio frequency channels used for communicating with user equipment 416 over the wireless air interface. In this way, the DAS 400 increases the coverage area for the uplink capacity provided by the base stations 440.

Figure 4C:
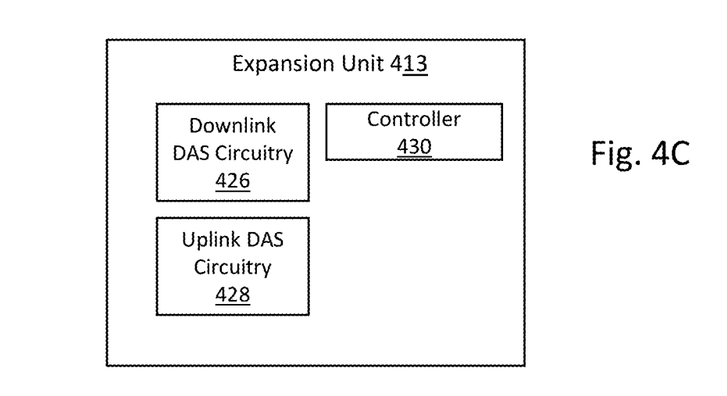

As shown in FIG. 4C, each expansion unit 413 comprises downlink DAS circuitry 426 that is configured to receive the downlink transport signals transmitted to it from the master unit 410 (or other expansion unit 413) and transmits the downlink transport signals to one or more remote antenna units 412 or other downstream intermediary units 413. Each expansion unit 413 comprises uplink DAS circuitry 428 that is configured to receive the respective uplink transport signals transmitted to it from one or more remote antenna units 412 or other downstream intermediary units 413, combine or sum the received uplink transport signals, and transmit the combined uplink transport signals upstream to the master unit 410 or other expansion unit 413.

The downlink DAS circuitry (411, 418, and 426) and uplink DAS circuitry (424, 421, and 428) can comprise one or more appropriate connectors, attenuators, combiners, splitters, amplifiers, filters, duplexers, analog-to-digital converters, digital-to-analog converters, mixers, field-programmable gate arrays (FPGAs), microprocessors, transceivers, framers, etc., to implement the features described above. Also, the downlink DAS circuitry 411, 418, and 426 and uplink DAS circuitry 424, 421, and 428 may share common circuitry and/or components. For example, some components (such as duplexers) by their nature are shared among the downlink DAS circuitry 411, 418, and 426 and uplink DAS circuitry 424, 421, and 428.

The DAS 400 can use either digital transport, analog transport, or combinations of digital and analog transport for generating and communicating the transport signals between the master units 410, the remote antenna units 412, and any expansion units 413. For the purposes of illustration, some of the embodiments described here are implemented using analog transport over optical cables. However, it is to be understood that other embodiments can be implemented in other ways, for example, in DASs that use other types of analog transport (for example, using other types of cable and/or using analog transport that makes use of frequency shifting), digital transport (for example, where digital samples indicative of the analog base station radio frequency signals and analog remote radio frequency signals are generated and communicated between the master units 410 and the remote antenna units 412), or combinations of analog and digital transport.

Each unit 410, 412, 413 in the DAS 400 can also comprises a respective controller 430. The controller 430 is implemented using one or more programmable processors and memory hardware that execute software that is configured to implement the various features described here as being implemented by the controller 430. The controller 430, the various features described here as being implemented by the controller 430, or portions thereof, can be implemented in other ways (for example, in a field programmable gate array (FPGA), application specific integrated circuit (ASIC), etc.). Each controller 430 is configured to monitor and control the operation of the associated unit. Each controller 430 is also configured to send and receive management data over the DAS 400.

In such an embodiment as disclosed by DAS 400, the downlink DAS circuitry 418 and Uplink DAS circuity 421 of each remote antenna unit 412 may define the RF source circuit 110 of FIG. 1, while the antenna 419 define the external RF load 112. As such, the un-mating of an antenna 419 from a remote antenna unit 412 may result in potential ESD and reverse power hazards. In this embodiment, one or more of the remote antenna units 412 comprise an RF protection coupler 420. The RF protection coupler 420 can mitigate ESD and reverse power hazards during such an un-mated external load configuration in the manner described by any of the embodiments above by coupling the antenna 419 to the remote antenna unit 412 via the RF protection coupler 420. In some embodiments, the RF protection coupler 420 may be implemented within the remote antenna unit 412, or externally coupled to an antenna port of the remote antenna unit 412.

When a connector 130 from the antenna 419 is coupled to the RF protection coupler 420, the electrical path through the RF protection coupler 420 of the remote antenna unit 412 to the antenna 419 is established. When no connector 130 from the antenna 419 is coupled to the RF protection coupler 420 output of the remote antenna unit 412 is electrically coupled to ground through an impedance load, the external load port of the RF protection coupler 420 is electrically coupled to ground, and the output of the remote antenna unit 412 is electrically isolated from the external load port of the RF protection coupler 420 by at least one electrically open air gap. The RF source circuit 110 (the downlink DAS circuitry 418 and/or Uplink DAS circuity 421 in the case of this remote antenna unit 412) are thus protected from the hazards of electrostatic discharge and reflected power that could be potentially injected into the circuit.

In some embodiments, the master unit 410 of DAS 400 may similarly comprise an RF protection coupler 420 for implementations where the master unit 410 communicates with the uplink base stations 440 via wireless RF signals. In that case the master unit 410 may define the RF source circuit 110 of FIG. 1, while an antenna 423 for the master unit 410 defines the external RF load 112 with the RF protection coupler 420 is position between the antenna 423 and an uplink RF output of the master unit 410 to mitigate hazards of ESD and reflected power as described above.

Figure 5:
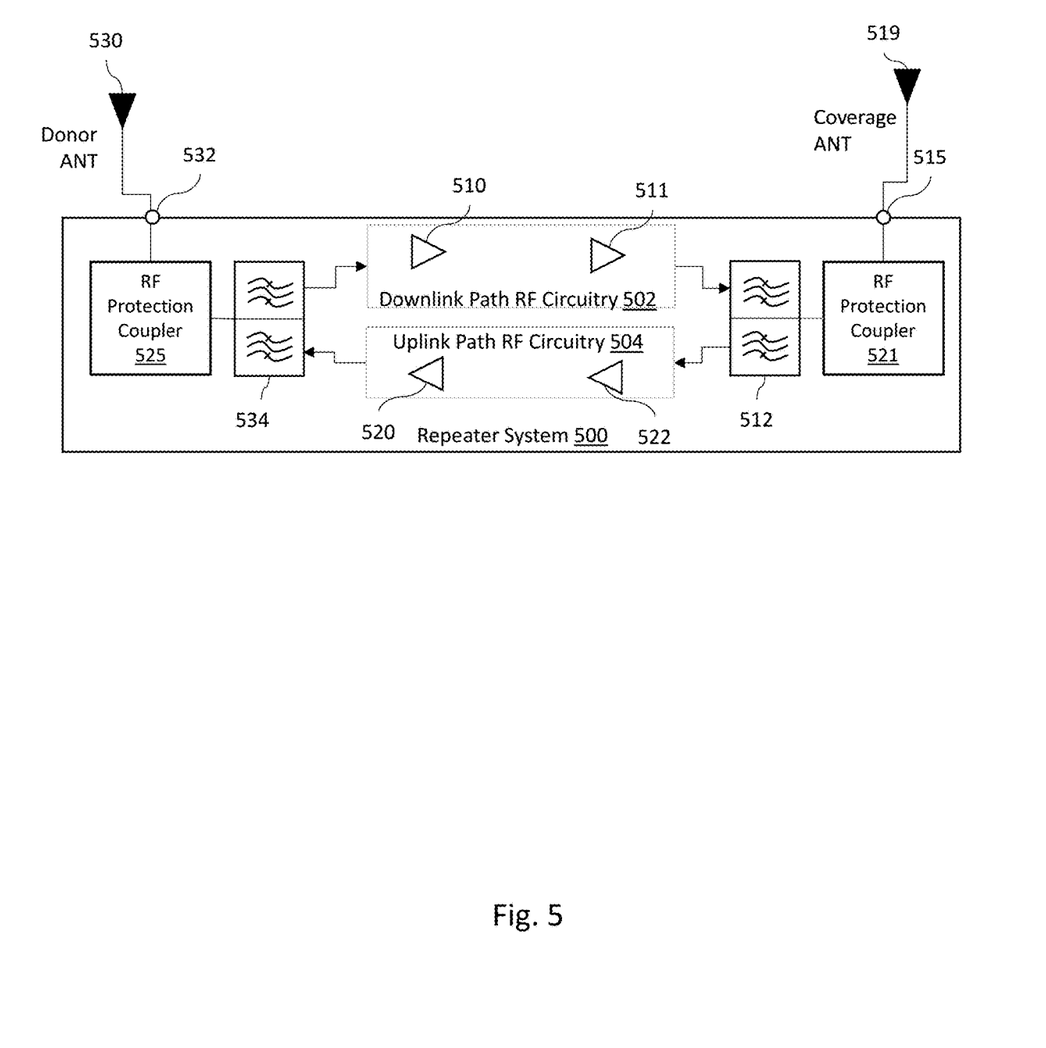
FIG. 5 is a block diagram illustrating an example repeater embodiment.

Utilization of an RF protection coupler such as described above may be used in conjunction with other RF systems. FIG. 5 provides one such example embodiment of a repeater system 500 comprising a downlink path RF circuitry 502 and uplink path RF circuitry 504. The downlink path RF circuitry 502 may include, for example a downlink low noise amplifier (LNA) 510 and a downlink power amplifier (PA) 511 while the uplink path RF circuitry 504 may include an uplink LNA 522 and an uplink PA 520. A first antenna port 532 is configured to couple the uplink path RF circuitry 504 and downlink path RF circuitry 502 to one or more donor antenna(s) 530 (for example, via a first duplexer 534).

A second antenna port 515 is configured to also couple the uplink path RF circuitry 504 and downlink path RF circuitry 502 to one or more coverage antennas 519 (for example, via a second duplexer 512). In the illustrated embodiment, the downlink path RF circuitry 502 power amplifies downlink signals received via the donor antenna(s) 530 to a desired power level and feeds it to antenna(s) 519 to radiate to provide wireless services coverage to user equipment. The uplink path RF circuitry 504 amplifies uplink signals received via the coverage antenna (419) to a desired power level and feeds it to antenna(s) 530 to radiate the signals to network communications equipment (such as wireless network base stations, for example).

In this embodiment, the repeater system 500 may further comprise an uplink RF protection coupler 525 to mitigate ESD and reverse power hazards when the donor antenna 530 is in an un-mated state, and a downlink RF protection coupler 521 to mitigate ESD and reverse power hazards when the coverage antenna 519 is in an un-mated state, in the manner described by any of the embodiments above. With respect to donor side ESD and reverse power hazards, the uplink path RF circuitry 504 and downlink path RF circuitry 502 may define the RF source circuit 110 with donor antenna 530 defining the external RF load 112 with the RF protection coupler 525 position between the donor antenna 530 and the uplink and downlink path RF circuitry 504 and 502. With respect to coverage side ESD and reverse power hazards, the uplink path RF circuitry 504 and downlink path RF circuitry 502 may define the RF source circuit 110 with coverage antenna 519 defining the external RF load 112 with the RF protection coupler 521 position between the coverage antenna 530 and the uplink and downlink path RF circuitry 504 and 502.

EXAMPLE EMBODIMENTS

A radio frequency (RF) protection coupler, the protection coupler comprising: a first port configured to couple to an output of an RF source circuit; a second port configured to couple to an external RF load; a source side RF switch and a load side RF switch, wherein the source side RF switch and the load side RF switch are each configured to switch between a first state and a second state in response to a detected matting status of a connector from the external RF load with the second port; wherein the first state is defined by the connector from the external RF load being mated with the second port, wherein in the first state the source side RF switch and the load side RF switch establish an electrically conductive RF signal path between the first port and second port; wherein the second state is defined by the connector from the external RF load being un-mated with the second port, wherein in the second state: the source side RF switch couples the first port to an impedance load, wherein the impedance load is impedance matched to the output of the RF source circuit; the load side RF switch couples the second port to an electrical ground; and an air gap between the source side RF switch and the load side RF switch electrically isolates the first port from the second port.

Example 2 includes the protection coupler of any of examples 1, wherein the source side RF switch and the load side RF switch are implemented by a double-pole double-throw switch.

Example 3 includes the protection coupler of any of examples 1-2, wherein the second port is configured to respond to a physical insertion or removal of the connector from the external RF load to cause the source side RF switch and a load side RF switch to switch between the first state and the second state.

Example 4 includes the protection coupler of example 3, wherein the timing of switching the source side RF switch is offset from the timing of switching the load side RF switch.

Example 5 includes the protection coupler of any of examples 1-4, wherein the impedance load is electrically coupled between the source side RF switch and the electrical ground.

Example 6 includes the protection coupler of any of examples 1-5, further comprising a housing that houses the source side RF switch and the load side RF switch.

Example 7 includes the protection coupler of example 6, wherein the impedance load is located within the housing; wherein the impedance load is thermally coupled to the housing by a conductive heat path.

Example 8 includes the protection coupler of any of examples 6-7, wherein the impedance load is embedded within the housing.

Example 9 includes the protection coupler of any of examples 6-8, wherein the impedance load is located external to the housing; wherein the impedance load is thermally coupled to a heat sink external to the housing.

Example 10 includes the protection coupler of any of examples 1-9, wherein the first port is configured to couple to the output of the RF source circuit via a cable.

Example 11 includes the protection coupler of any of examples 1-10, wherein the first port is configured to couple the protection coupler to the output of the RF source circuit via a circuit board edge connector.

Example 12 includes the protection coupler of any of examples 1-11, wherein the protection coupler is co-located on a circuit board with the RF source circuit.

Example 13 includes the protection coupler of any of examples 1-12, wherein the second port is configured to couple to the external RF load via a cable, wherein the connector is a connector of the cable.

Example 14 includes the protection coupler of any of examples 1-13, wherein the connector is an integral element of the external RF load.

Example 15 includes a radio frequency (RF) protection coupler, the protection coupler comprising: a housing having a first end that defines a load connector port configured to couple to an RF external load, and a second end that defines a source side port configured to electrically couple to an output of an RF source circuit; a first center pin comprising a pin receiver basket, wherein the first center pin is spring loaded and configured to slide within the housing in response to a force applied when receiving a connector for the external RF load; a second center pin coupled to the source side port wherein the first center pin is spring loaded and configured to slide within the housing in response to a force applied by the first center pin onto the second center pin when receiving the connector for the external RF load; wherein when the connector for the external RF load is mated to the source side port, the first center pin slides into contact with the second center pin to establish an electrically conductive RF signal path between the source side port and the load connector port; wherein when the connector for the external RF load is not mated to the source side port: the first center pin slides into a position that form an air gap between the first center pin and the second center pin that electrically isolates the source side port from the load connector port, and where the first center pin couples the load connector port to an electrical ground; and the second center pin couples the source side port an impedance load, wherein the impedance load is impedance matched to the output of the RF source circuit.

Example 16 includes the protection coupler of example 15, wherein when the connector for the external RF load is not mated to the source side port: the first center pin is coupled to the electrical ground by a ground connection conductor that couples the first center pin to the housing; and the second center pin is coupled to impedance load by an embedded electrical conductor.

Example 17 includes the protection coupler of any of examples 15-16, wherein the impedance load is embedded within a body of the housing.

Example 18 includes the protection coupler of any of examples 15-17, wherein the impedance load is thermally coupled by a conductive heat path to the housing.

Example 19 includes the protection coupler of any of examples 15-18, wherein the impedance load is thermally coupled by a conductive heat path to a heat sink external to the housing.

Example 20 includes a distributed antenna system (DAS), the system comprising: a master unit configured to receive a base station downlink radio frequency signal from at least one base station, and configured to transmit a base station uplink radio frequency signal to the at least one base station; a plurality of remote antenna units that are each communicatively coupled to the master unit, the plurality of remote antenna units each configured to radiate a remote downlink radio frequency signal from at least one antenna into a coverage area and to receive a remote uplink radio frequency signal from the coverage area via the at least one antenna; wherein each of the remote antenna units comprises the protection coupler of any of claims 1-18, wherein each of the remote antenna units are coupled to the at least one antenna through the protection coupler.

Example 21 includes a radio frequency (RF) repeater system, the system comprising: a first antenna port configured to couple to at least one donor antenna; a second antenna port configured to couple to a least one coverage antenna; downlink path RF circuitry configured to transport downlink RF signals received from the first antenna port to the second antenna port; uplink path RF circuitry configured to transport uplink RF signal received from the second antenna port to the first antenna port; a first protection coupler comprising the protection coupler of any of claims 1-18, wherein the first antenna port is coupled to the downlink path RF circuitry and uplink path RF circuitry through the first protection coupler; a second protection coupler comprising the protection coupler of any of claims 1-18, wherein the second antenna port is coupled to the downlink path RF circuitry and uplink path RF circuitry through the second protection coupler.

Example 22 includes a radio frequency (RF) communication system, the system comprising: a RF source circuit comprising at least a transmitter configured to transmit an RF signal to an RF external load; a RF protection coupler coupled to an output of the RF source circuit, wherein the first RF protection coupler comprises the protection coupler of any of claims 1-18, wherein the RF protection coupler is configured to couple the external RF load to the output of the RF source circuit.

Example 23 includes the system of any of example 22, wherein the RF source circuit comprises at least one of: a wireless network access point; a distributed antenna system remote antenna unit; an RF repeater; a cellular communications base station; or a small cell base station.

In various alternative embodiments, system and/or device elements, method steps, or example implementations described throughout this disclosure (such as any of the master units, remote antenna units, expansion units, controllers, circuits, or sub-parts thereof, for example) may be implemented at least in part using one or more computer systems, field programmable gate arrays (FPGAs), or similar devices comprising a processor coupled to a memory and executing code to realize those elements, processes, or examples, said code stored on a non-transient hardware data storage device. Therefore, other embodiments of the present disclosure may include elements comprising program instructions resident on computer readable media which when implemented by such computer systems, enable them to implement the embodiments described herein. As used herein, the term "computer readable media" refers to tangible memory storage devices having non-transient physical forms. Such non-transient physical forms may include computer memory devices, such as but not limited to punch cards, magnetic disk or tape, any optical data storage system, flash read only memory (ROM), non-volatile ROM, programmable ROM (PROM), erasable-programmable ROM (E-PROM), random access memory (RAM), or any other form of permanent, semi-permanent, or temporary memory storage system or device having a physical, tangible form. Program instructions include, but are not limited to computer-executable instructions executed by computer system processors and hardware description languages such as Very High Speed Integrated Circuit (VHSIC) Hardware Description Language (VHDL).

It should be appreciated that other network architectures may be implemented that still functionally operate in the same manner as described in any of the embodiments described herein. It should also be understood that for any of the embodiments described herein, while the communication links connecting master units and remote antenna units may comprise optical fiber, in other embodiments other wired or wireless communication links, or combinations thereof, may be utilized instead of, or in combination with, optical fiber communication links.

As used herein, DAS and repeater system related terms such as "master unit", "remote unit", "remote antenna unit", "expansion unit", "control unit", "circuit", "circuitry", "switch", "load", "coupler" refer to the names of hardware elements that would be immediately recognized and understood by those of skill in the art of wireless communications and are not used herein as nonce words or nonce terms for the purpose of invoking 35 USC 112(f).

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the presented embodiments. Therefore, it is manifestly intended that embodiments be limited only by the claims and the equivalents thereof.

What is claimed is:

1. A radio frequency (RF) protection coupler, the protection coupler comprising:
    a first port configured to couple to an output of an RF source circuit;
    a second port configured to couple to an external RF load;
    a source side RF switch and a load side RF switch, wherein the source side RF switch and the load side RF switch are each configured to switch between a first state and a second state in response to a detected matting status of a connector from the external RF load with the second port; and
    wherein the first state is defined by the connector from the external RF load being mated with the second port, wherein in the first state the source side RF switch and the load side RF switch establish an electrically conductive RF signal path between the first port and second port;
    wherein the second state is defined by the connector from the external RF load being un-mated with the second port, wherein in the second state:
        the source side RF switch couples the first port to an impedance load, wherein the impedance load is impedance matched to the output of the RF source circuit;
        the load side RF switch couples the second port to an electrical ground; and
        an air gap between the source side RF switch and the load side RF switch electrically isolates the first port from the second port.

2. The protection coupler of claim 1, wherein the source side RF switch and the load side RF switch are implemented by a double-pole double-throw switch.

3. The protection coupler of claim 1, wherein the second port is configured to respond to a physical insertion or removal of the connector from the external RF load to cause the source side RF switch and a load side RF switch to switch between the first state and the second state.

4. The protection coupler of claim 3, wherein a timing of switching the source side RF switch is offset from the timing of switching the load side RF switch.

5. The protection coupler of claim 1, wherein the impedance load is electrically coupled between the source side RF switch and the electrical ground.

6. The protection coupler of claim 1, further comprising a housing that houses the source side RF switch and the load side RF switch.

7. The protection coupler of claim 6, wherein the impedance load is located within the housing;
wherein the impedance load is thermally coupled to the housing by a conductive heat path.

8. The protection coupler of claim 6, wherein the impedance load is embedded within the housing.

9. The protection coupler of claim 6, wherein the impedance load is located external to the housing;
wherein the impedance load is thermally coupled to a heat sink external to the housing.

10. The protection coupler of claim 1, wherein the first port is configured to couple the protection coupler to the output of the RF source circuit via a circuit board edge connector.

11. The protection coupler of claim 1, wherein the protection coupler is co-located on a circuit board with the RF source circuit.

12. The protection coupler of claim 1, wherein the second port is configured to couple to the external RF load via a cable, wherein the connector is a connector of the cable.

13. The protection coupler of claim 1, wherein the connector is an integral element of the external RF load.

14. The protection coupler of claim 1, wherein the RF source circuit comprises at least one of:
a wireless network access point;
a distributed antenna system remote antenna unit;
an RF repeater;
a cellular communications base station; or
a small cell base station.

15. A radio frequency (RF) protection coupler, the protection coupler comprising:
a housing having a first end that defines a load connector port configured to couple to an RF external load, and a second end that defines a source side port configured to electrically couple to an output of an RF source circuit;
a first center pin comprising a pin receiver basket, wherein the first center pin is spring loaded and configured to slide within the housing in response to a force applied when receiving a connector for the external RF load;
a second center pin coupled to the source side port wherein the first center pin is spring loaded and configured to slide within the housing in response to a force applied by the first center pin onto the second center pin when receiving the connector for the external RF load; and
wherein when the connector for the external RF load is mated to the source side port, the first center pin slides into contact with the second center pin to establish an electrically conductive RF signal path between the source side port and the load connector port;
wherein when the connector for the external RF load is not mated to the source side port:
the first center pin slides into a position that form an air gap between the first center pin and the second center pin that electrically isolates the source side port from the load connector port, and where the first center pin couples the load connector port to an electrical ground; and
the second center pin couples the source side port an impedance load, wherein the impedance load is impedance matched to the output of the RF source circuit.

16. The protection coupler of claim 15, wherein when the connector for the external RF load is not mated to the source side port:
the first center pin is coupled to the electrical ground by a ground connection conductor that couples the first center pin to the housing; and
the second center pin is coupled to impedance load by an embedded electrical conductor.

17. The protection coupler of claim 15, wherein the impedance load is embedded within a body of the housing.

18. The protection coupler of claim 15, wherein the impedance load is thermally coupled by a conductive heat path to the housing.

19. The protection coupler of claim 15, wherein the impedance load is thermally coupled by a conductive heat path to a heat sink external to the housing.

20. The protection coupler of claim 15, wherein the RF source circuit comprises at least one of:
a wireless network access point;
a distributed antenna system remote antenna unit;
an RF repeater;
a cellular communications base station; or
a small cell base station.

* * * * *